United States Patent
Reche et al.

(10) Patent No.: US 9,483,370 B2
(45) Date of Patent: *Nov. 1, 2016

(54) ERROR DETECTION/CORRECTION BASED MEMORY MANAGEMENT

(71) Applicant: Micron Technology, Inc., Boise, ID (US)

(72) Inventors: Cory J. Reche, Boise, ID (US); Leland R. Nevill, Boise, ID (US); Timothy F. Martin, Boise, ID (US)

(73) Assignee: Micron Technology, Inc., Boise, ID (US)

(*) Notice: Subject to any disclaimer, the term of this patent is extended or adjusted under 35 U.S.C. 154(b) by 341 days.

This patent is subject to a terminal disclaimer.

(21) Appl. No.: 14/182,963

(22) Filed: Feb. 18, 2014

(65) Prior Publication Data

US 2014/0164824 A1 Jun. 12, 2014

Related U.S. Application Data

(63) Continuation of application No. 13/675,870, filed on Nov. 13, 2012, now Pat. No. 8,683,298, which is a continuation of application No. 12/606,486, filed on Oct. 27, 2009, now Pat. No. 8,312,349.

(51) Int. Cl.
| | |
|---|---|
| *G06F 11/00* | (2006.01) |
| *G06F 11/20* | (2006.01) |
| *G06F 11/07* | (2006.01) |
| *G06F 11/10* | (2006.01) |
| *G11C 16/34* | (2006.01) |
| *H03M 13/15* | (2006.01) |
| *H03M 13/19* | (2006.01) |

(52) U.S. Cl.
CPC ......... *G06F 11/2053* (2013.01); *G06F 11/073* (2013.01); *G06F 11/076* (2013.01); *G06F 11/0793* (2013.01); *G06F 11/1048* (2013.01); *G11C 16/349* (2013.01); *H03M 13/15* (2013.01); *H03M 13/152* (2013.01); *H03M 13/1515* (2013.01); *H03M 13/19* (2013.01)

(58) Field of Classification Search
CPC ............... G06F 11/073; G06F 11/076; G06F 11/0793; G06F 11/1048; G06F 11/2053; G11C 16/349; H03M 13/15; H03M 13/1515; H03M 13/152; H03M 13/19
See application file for complete search history.

(56) References Cited

U.S. PATENT DOCUMENTS

| | | | |
|---|---|---|---|
| 5,014,273 A | 5/1991 | Gagliardo et al. | |
| 6,000,006 A * | 12/1999 | Bruce | G06F 11/1068 711/103 |
| 6,339,546 B1 * | 1/2002 | Katayama | G06F 11/1008 365/185.09 |
| 6,948,026 B2 * | 9/2005 | Keays | G06F 12/0246 365/185.29 |
| 7,587,658 B1 | 9/2009 | Tong et al. | |
| 7,765,426 B2 * | 7/2010 | Li | G06F 11/073 714/6.13 |

(Continued)

*Primary Examiner* — Marc Duncan
(74) *Attorney, Agent, or Firm* — Brooks, Cameron & Huebsch, PLLC

(57) ABSTRACT

The present disclosure includes methods, devices, and systems for error detection/correction based memory management. One embodiment includes performing a read operation with respect to a particular group of memory cells of a memory device and, if the read operation results in an uncorrectable error, determining whether to retire the particular group of memory cells in response to a status of an indicator corresponding to the particular group of memory cells, wherein the status of the indicator indicates whether the particular group of memory cells has a previous uncorrectable error associated therewith.

13 Claims, 4 Drawing Sheets

(56) References Cited

U.S. PATENT DOCUMENTS

| | | | |
|---|---|---|---|
| 8,046,645 B2 | 10/2011 | Hsu et al. | |
| 8,312,349 B2* | 11/2012 | Reche | G06F 11/073 714/6.13 |
| 8,510,614 B2* | 8/2013 | Liu | G06F 11/006 714/722 |
| 8,533,562 B2* | 9/2013 | Mee | G06F 11/1441 711/103 |
| 8,683,298 B2* | 3/2014 | Reche | G06F 11/073 714/6.13 |
| 8,910,002 B2* | 12/2014 | Schuette | G11C 16/349 714/723 |
| 9,306,599 B2* | 4/2016 | Flynn | G06F 11/073 |
| 9,400,705 B2* | 7/2016 | Bowers | G06F 11/0727 |
| 2002/0080650 A1* | 6/2002 | Katayama | G06F 11/1008 365/185.09 |
| 2003/0225961 A1 | 12/2003 | Chow et al. | |
| 2006/0242484 A1* | 10/2006 | Roohparvar | G06F 11/073 714/715 |
| 2006/0248268 A1 | 11/2006 | Roohparvar | |
| 2007/0038901 A1* | 2/2007 | Shiota | G11C 16/349 714/54 |
| 2008/0307270 A1 | 12/2008 | Li | |
| 2009/0055680 A1 | 2/2009 | Honda et al. | |
| 2010/0058109 A1 | 3/2010 | Chang et al. | |
| 2010/0122148 A1 | 5/2010 | Flynn et al. | |
| 2010/0325524 A1* | 12/2010 | Yang | G06F 11/1068 714/773 |
| 2013/0080691 A1* | 3/2013 | Weingarten | G06F 12/0246 711/103 |
| 2013/0238839 A1* | 9/2013 | Weingerten | G06F 12/0246 711/103 |

\* cited by examiner

ERROR DETECTION/CORRECTION BASED MEMORY MANAGEMENT

PRIORITY INFORMATION

This application is a continuation of U.S. application Ser. No. 13/675,870, filed Nov. 13, 2012, which is a continuation of U.S. Ser. No. 12/606,486, filed Oct. 27, 2009, which are incorporated by reference.

TECHNICAL FIELD

The present disclosure relates generally to semiconductor memory devices, methods, and systems, and more particularly, to error detection/correction based memory management.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored information when not powered and can include NAND flash memory, NOR flash memory, read only memory (ROM), Electrically Erasable Programmable ROM (EEPROM), Erasable Programmable ROM (EPROM), and phase change random access memory (PCRAM), among others.

Various types of memory can be used in memory systems. For example, Flash memory can be part of a memory system as internal memory or as removable memory that can be coupled to the memory system through an interface via a format such as USB (universal serial bus), MMC (multi media card), CF (compact flash), or SD (secure digital), among others. Flash memory devices, including floating gate flash devices and charge trap flash (CTF) devices, may be utilized as non-volatile memory for a wide range of electronic applications. Flash memory devices typically use a one-transistor memory cell that allows for high memory densities, high reliability, and low power consumption.

Uses for flash memory include memory for sold state drives (SSDs), personal computers, personal digital assistants (PDAs), digital cameras, cellular telephones, portable music players, e.g., MP3 players, and movie players. Data, such as program code, user data, and/or system data, such as a basic input/output system (BIOS), are typically stored in flash memory devices. Some uses of flash memory may include multiple reads of data programmed to a flash memory device without erasing the data.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to (and in some cases form) an access line (e.g., a word line as commonly referred to in the art). However each memory cell is not directly coupled to a data line (e.g., a bit line as commonly referred to in the art) by its drain. Instead, the memory cells of the array are coupled together in series, source to drain, between a common source and a bit line, where the memory cells commonly coupled to a particular bit line are referred to as a "column".

A NAND memory device can include a number of arrays of memory cells organized into physical blocks of memory cells. Data stored in the blocks can become corrupted due to various mechanisms (e.g., program disturb, read disturb, and/or erase disturb, among other mechanisms). For instance, one or more bits of data associated with a page of data being read may have changed (e.g., become incorrect) since it was stored to a particular block. Many memory systems employ an error detection/correction engine capable of detecting and correcting a certain number of incorrect bits associated with read operations. Such detection/correction engines may use an error correction code (ECC) to detect and/or correct incorrect bits. An ECC failure results when the detection/correction engine is not capable of correcting all of the incorrect bits within the data being read (e.g., the number of bit failures within the data exceeds the correction capabilities of the detection/correction engine). This can be referred to as an uncorrectable ECC error (a UECC error).

A UECC error can indicate that the data stored within a particular block has become corrupted (e.g., one or more bits have become incorrect due to various disturb mechanisms). A UECC error can also indicate that a particular block/page is defective (e.g., the particular block/page includes defective memory cells). As such, future read operations on the same block/page may also result in UECC errors, which can result in reduced system performance and/or system failure. In various memory systems, a block/page is retired from use if an uncorrectable ECC error is encountered in association with a read operation performed on the block/page. However, retiring blocks/pages from use has drawbacks such as reducing the memory capacity of the system and increasing wear on the remaining blocks/pages, which can reduce the effective life of a memory device, among other drawbacks.

DETAILED DESCRIPTION

Figure 1:
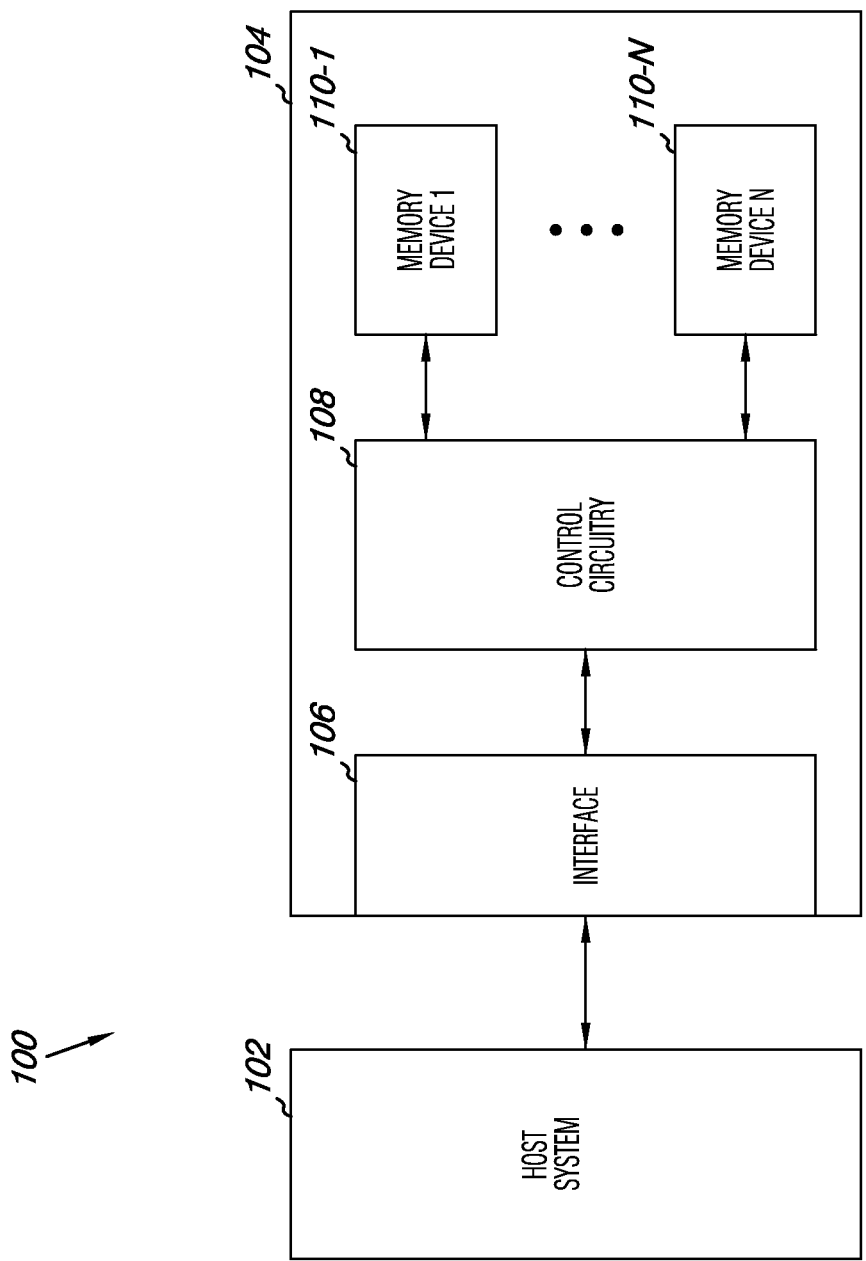
FIG. 1 is a functional block diagram of a system including at least one memory system, in accordance with one or more embodiments of the present disclosure.

The present disclosure includes methods, devices, and systems for error detection/correction based memory management. One embodiment includes performing a read operation with respect to a particular group of memory cells of a memory device and, if the read operation results in an uncorrectable error, determining whether to retire the particular group of memory cells in response to a status of an indicator corresponding to the particular group of memory cells, wherein the status of the indicator indicates whether the particular group of memory cells has a previous uncorrectable error associated therewith.

Embodiments of the present disclosure can improve memory system lifetime and performance and/or can reduce system failure by performing efficient block management.

For instance, embodiments can retire defective memory groups in an effective and efficient manner, while maintaining an effective memory capacity of the system and limiting wear.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N," "M," "R," and "S," particularly with respect to reference numerals in the drawings, indicates that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 108 may reference element "08" in FIG. 1, and a similar element may be referenced as 208 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a functional block diagram of a system 100 including at least one memory system 104, in accordance with one or more embodiments of the present disclosure. In the embodiment illustrated in FIG. 1, the memory system 104 (e.g., a solid state drive) can include a physical host interface 106, memory system controller, such as control circuitry 108, and one or more memory devices 110-1, . . . , 110-N. The memory devices 110-1, . . . , 110-N can provide a storage volume for the memory system (e.g., with a file system formatted to the memory devices). In one or more embodiments, the memory system control circuitry 108 can be an application specific integrated circuit (ASIC) coupled to a printed circuit board including the physical interface 106 and memory devices 110-1, . . . , 110-N.

As illustrated in FIG. 1, the memory system control circuitry 108 can be coupled to the physical host interface 106 and to the memory devices 110-1, . . . , 110-N. The physical host interface 106 can be used to communicate information between the memory system 104 and another device such as a host system 102. Host system 102 can include a memory access device (e.g., a processor). One of ordinary skill in the art will appreciate that "a processor" can intend one or more processors, such as a parallel processing system, a number of coprocessors, etc. Examples of host systems include laptop computers, personal computers, digital cameras, digital recording and playback devices, mobile telephones, PDAs, memory card readers, interface hubs, and the like. For one or more embodiments, the physical host interface 106 can be in the form of a standardized interface. For example, when the memory system 104 is used for data storage in a computing system 100, the physical host interface 106 can be a serial advanced technology attachment (SATA), serial attached SCSI (SAS), fibre channel, peripheral component interconnect express (PCIe), or a universal serial bus (USB), among other connectors and interfaces. In general, however, physical host interface 106 can provide an interface for passing control, address, data, and other signals between the memory system 104 and a host system 102 having compatible receptors for the physical host interface 106.

The memory system control circuitry 108 can communicate with the memory devices 110-1, . . . , 110-N to read, write, and erase data, among other operations. Memory system control circuitry 108 can have circuitry that may be one or more integrated circuits and/or discrete components. For one or more embodiments, the circuitry in memory system control circuitry 108 may include control circuitry for controlling access across the memory devices 110-1, . . . , 110-N and circuitry for providing a translation layer between a host system 102 and the memory system 104. Thus, a memory controller could selectively couple an I/O connection (not shown in FIG. 1) of a memory device 110-1, . . . , 110-N to receive the appropriate signal at the appropriate I/O connection at the appropriate time. Similarly, the communication protocol between a host system 102 and the memory system 104 may be different than what is required for access of a memory device 110-1, . . . , 110-N. Memory system control circuitry 108 could then translate the commands received from a host into the appropriate commands to achieve the desired access to a memory device 110-1, . . . , 110-N.

The memory devices 110-1, . . . , 110-N can include one or more non-volatile memory devices (e.g., a flash memory device) and one or more volatile memory devices (e.g., a DRAM device). A non-volatile memory device can include one or more arrays of memory cells (e.g., non-volatile memory cells). The arrays can be flash arrays with a NAND architecture, for example.

The memory devices 110-1, . . . , 110-N can include a number of memory cells that can be grouped. As used herein, a group can include one or more memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4314 bytes of data per page, 128 pages per block, 2048 blocks per plane, and 16 planes per device.

The memory system 104 can implement wear leveling to control the wear rate on the memory devices 110-1, . . . , 110-N. As an example, a flash memory array can experience failure after a number of program and/or erase cycles. Wear leveling can reduce the number of program and/or erase cycles performed on a particular group. Wear leveling can include dynamic wear leveling to minimize the amount of valid blocks moved to reclaim a block. Dynamic wear leveling can include a technique called garbage collection in which blocks with more than a threshold amount of invalid pages are reclaimed by erasing the block. An invalid page, for example, can be a page of data that has been updated to a different page. Static wear leveling includes writing static data to blocks that have high erase counts to prolong the life of the block.

The embodiment of FIG. 1 can include additional circuitry that is not illustrated so as not to obscure embodiments of the present disclosure. For example, the memory system 104 can include address circuitry to latch address signals provided over I/O connections through I/O circuitry.

Address signals can be received and decoded by a row decoder and a column decoder to access the memory devices 110-1, . . . , 110-N. It will be appreciated by those skilled in the art that the number of address input connections can depend on the density and architecture of the memory devices 110-1, . . . , 110-N.

Figure 2:
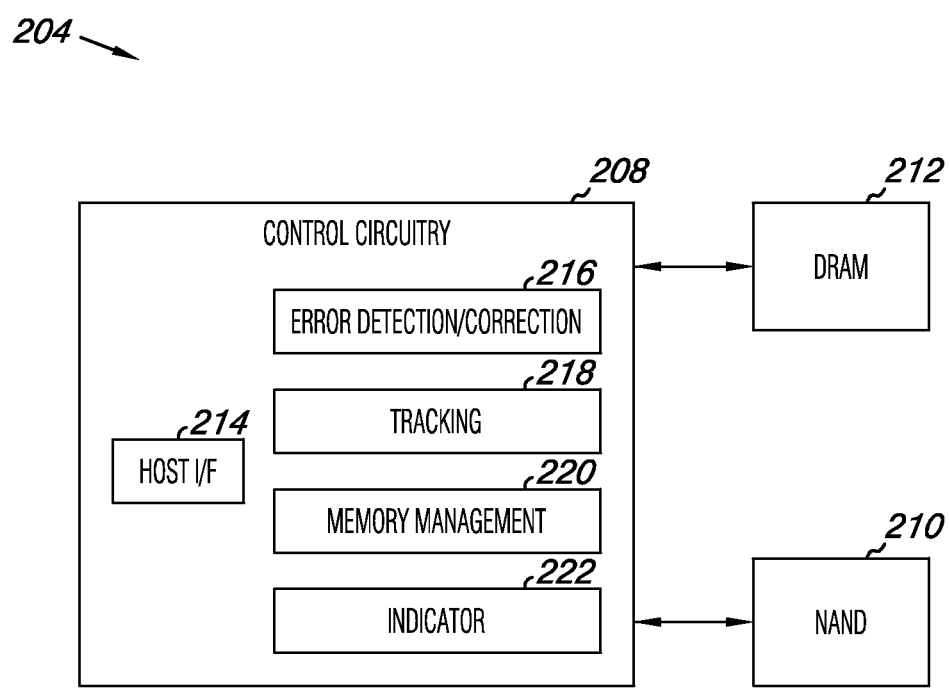
FIG. 2 is a functional block diagram of a memory system in accordance with one or more embodiments of the present disclosure.

FIG. 2 is a functional block diagram of a memory system 204 in accordance with one or more embodiments of the present disclosure. The memory system 204 can include memory system control circuitry 208. The memory system control circuitry 208 can be coupled to one or more memory devices (e.g., non-volatile memory 210 and/or volatile memory 212). In the example illustrated in FIG. 2, non-volatile memory 210 is a NAND flash device and volatile memory 212 is a DRAM device. Memory system 204 and memory system control circuitry 208 can be analogous to respective memory system 104 and memory system control circuitry 108 illustrated in FIG. 1.

The memory system control circuitry 208 can include a host interface component 214, an error detection/correction component 216, a tracking component 218, a memory management component 220, and an indicator component 222. As described herein, the memory system control circuitry 208 and components thereof can be provided in the form of circuitry (e.g., an ASIC); however, embodiments are not so limited.

The host interface 214 can be coupled to and/or incorporated with a physical interface to a host system, such as physical interface 106 illustrated in FIG. 1. The host interface 214 can interface with a host system, e.g., host system 102 in FIG. 1, through a number of layers including a physical layer, a link layer, and/or a transport layer. One of ordinary skill in the art will appreciate that the number of layers for a particular host interface can be defined by an interface standard such as serial advanced technology attachment (SATA), serial attached SCSI (SAS), fibre channel, peripheral component interconnect express (PCIe), universal serial bus (USB), etc. In general, the host interface 214 is responsible for converting command packets received from the host system into command instructions and for converting host-memory translation responses into host system commands for transmission to the requesting host. For example, the host interface 214 can construct SATA command packets from PCIe based transaction layer packets. The host interface 214 can be configured to receive data associated with a plurality of addresses from a host system. The host interface 214 can receive updated data associated with one or more of the plurality of addresses.

Host-memory translation circuitry (not shown in FIG. 2) can be coupled to the host interface 214 and can be configured to translate host addresses to memory addresses (e.g., addresses associated with a received command such as a read and/or write command). The host-memory translation circuitry might, for example, convert host sector read and write operations to commands directed to specific portions of the non-volatile memory 210. Each host operation can be translated into single or multi-sector non-volatile memory 210 operations. For example, host read and write commands can be translated into non-volatile memory 210 read and write commands.

The memory management component 220 can control a number of processes including but not limited to initialization, wear leveling (e.g., garbage collection, block reclamation, and/or block retirement), and/or error detection/correction (e.g., via operation of processor). As discussed above, the error detection/correction component 216 can be used to detect errors in data read from memory device 210. The error detection/correction component 216 can be configured to apply error correction such as BCH (Bose-Chaudhuri-Hochquenghem) error correction, as will be understood by one of ordinary skill in the art, to detect and/or correct errors associated with data stored in the non-volatile memory 210. For example, the error detection/correction component 216 can provide 29 bits of error correction over a 1080-bit code word. The error detection/correction component 216 can be configured to provide differing error correction schemes for single and/or multi level cell (SLC/MLC) operation. The error detection/correction component 216 can detect errors that are not correctable by the error detection/correction component (e.g., UECC errors), such as by determining that there are more than a threshold amount of correctable errors associated with data being read (e.g., the data being read contains more than a threshold number of incorrect bits). In one or more embodiments, the error detection/correction component 216 may use an error correction code (ECC) for detecting and/or correcting incorrect data bits in data being read. The code may be a BCH code, a Hamming code, or a Reed-Soloman code, among other error correction codes.

In one or more embodiments of the present disclosure, the control circuitry 208 can be configured to determine whether to retire a group of memory cells (e.g., a block of memory cells) in response to a status of an indicator (e.g., indicator 222). For instance, as described further herein, the control circuitry 208 can be configured to, for each of a number of particular groups of memory cells of the memory device (e.g., NAND memory device 210), update a status of an indicator 222 corresponding to the particular group of memory cells when a read operation performed with respect to the particular group of memory cells results in an uncorrectable error (e.g., an error not correctable by error detection/correction component 216). The number of particular groups of memory cells can be, for instance, a particular block of memory cells or a particular page of memory cells. Although examples used herein may refer to particular blocks, it is to be understood that embodiments are also applicable to particular pages.

The indicator component 222 can include a number of indicators that each correspond to a particular block associated with memory device 210. The indicator 222 can be, for example, a flag that can be used indicate that a particular block has previously experienced an uncorrectable error (e.g., the flag can be set in response to the particular block experiencing an uncorrectable error). In one or more embodiments, the indicators within component 222 include counters that can be updated (e.g., incremented) each time the particular block to which the counter corresponds experiences an uncorrectable error. As described further herein, in one or more embodiments, the control circuitry 208 can be configured to retire a particular block if the status of the indicator 222 indicates a threshold number of uncorrectable errors associated with the particular block has been reached. The threshold number may be one, but embodiments are not so limited. For instance, the control circuitry 208 may retire a particular block once a counter 222 indicates the particular block has experienced more than one uncorrectable error (e.g., two, three, four, or more uncorrectable errors).

As illustrated in the example shown in FIG. 2, the indicators 222 are located within control circuitry 208. However, as described further herein, the indicators 222 can be stored elsewhere within system 204 (e.g., within non-volatile memory device 210, or within volatile memory device 212, at least temporarily).

In one or more embodiments, the tracking component 218 can be configured to track a ratio of total uncorrectable errors (e.g., UECC errors) to total data throughput associated with the memory device 210. For instance, the tracking component 218 can determine the number of uncorrectable errors per megabyte (MB) of data entering device 210 (e.g., data entering device 210 from a host system such as host 102 illustrated in FIG. 1). The ratio of uncorrectable errors to MB of data entering the device 210 can be used as an indicator of device wear-out. For instance, as the memory device 210 is operated over time, the number of uncorrectable errors associated with read operations performed on the blocks/pages of the device is likely to increase. In one or more embodiments, the ratio can be provided to the host through an interface (e.g., to host 102 through interface 106 as illustrated in FIG. 1). As an example, the ratio can be provided to a display of the host and can be monitored as an indicator of device performance.

Figure 3:
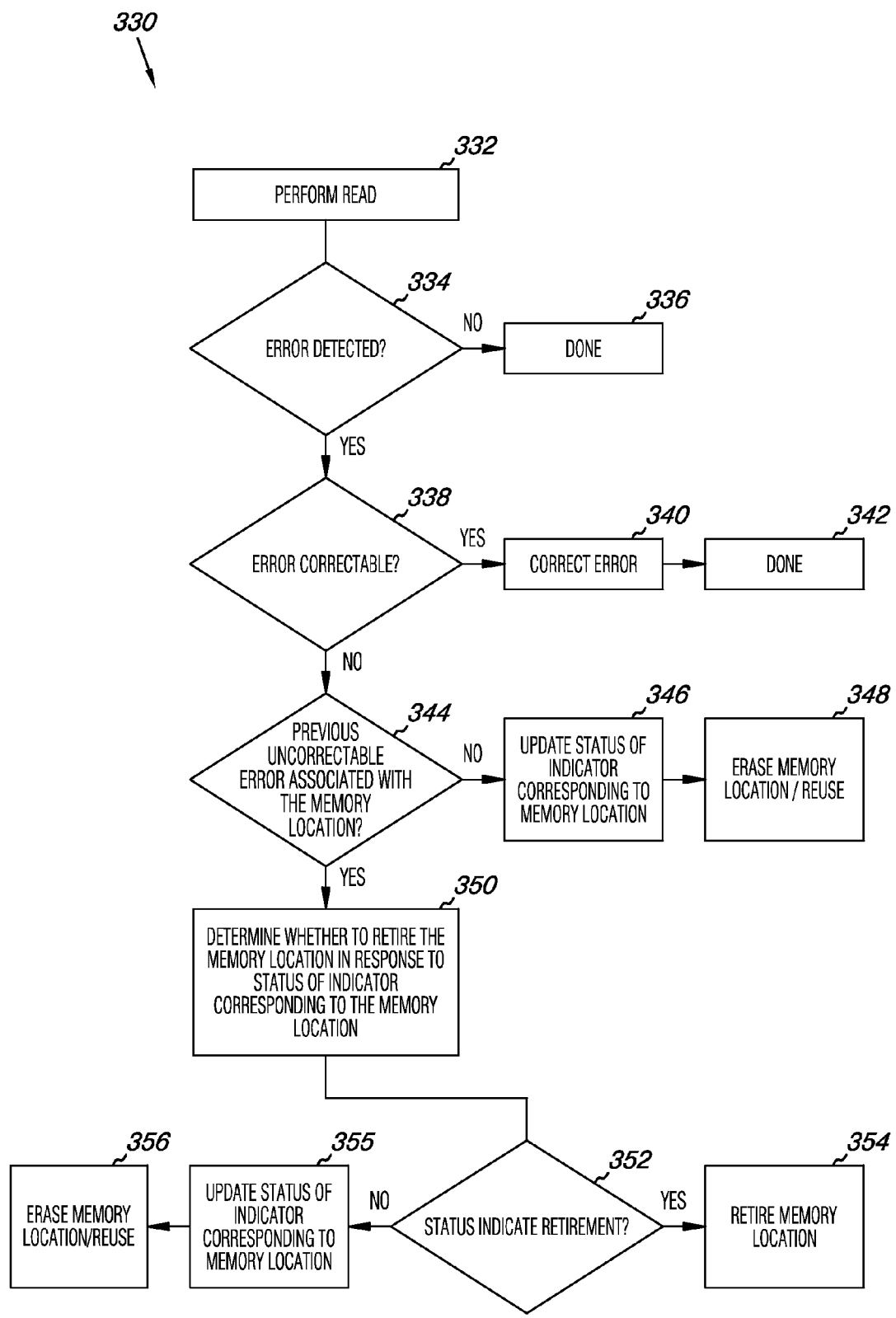
FIG. 3 is a flow diagram illustrating error detection/correction based memory management in accordance with one or more embodiments of the present disclosure.

FIG. 3 is a flow diagram 330 illustrating error detection/correction based memory management in accordance with one or more embodiments of the present disclosure. As indicated at reference 332, a read operation is performed with respect to a particular group of memory cells of a memory device such as memory device 210. As one of ordinary skill in the art will appreciate, the data being read can have error detection/correction information associated therewith (e.g., the data can be stored along with ECC information such as an ECC). The particular group of memory cells can be a number of memory cells associated with a page of data, which can be located within a particular block.

At reference 334, it is determined whether the data being read in conjunction with the read operation contains one or more errors (e.g., one or more incorrect bits). For instance, an error detection/correction component such as component 216 can be used to detect the errors. As illustrated at reference 336, if the data does not include errors, then the read operation is completed.

As illustrated at reference 338, if the data being read includes one or more errors, then it is determined whether the error(s) is correctable (e.g., by an error detection/correction component such as 216 shown in FIG. 2). If the error(s) is correctable (e.g., if the number of errors is not above the threshold number capable of being corrected by the component 216), then the error(s) is corrected at reference 340 and the read operation is completed at reference 342.

In one or more embodiments, and as illustrated at reference 344, if the error(s) is not correctable (e.g., by the component 216), then it is determined whether the particular group of memory cells (e.g., block) has a previous uncorrectable error associated therewith. As described above, an indicator (e.g., indicator 222) corresponding to the particular block can be used to indicate whether a previous read operation performed with respect to the block resulted in an uncorrectable error. For instance, a flag corresponding to the particular block can be checked to determine whether the block has a previous uncorrectable error associated therewith. If the status of the indicator indicates that the particular block does not have a previous uncorrectable error associated therewith, then the status of the indicator corresponding to the particular block can be updated as illustrated at reference 346. As an example, a read operation performed with respect to a particular block results in an uncorrectable error if component 216 determines that the particular data being read from the block includes more incorrect bits than are correctable by component 216. If the read operation results in an uncorrectable error, then the block with respect to which the read operation was performed can be said to have experienced an uncorrectable error.

Updating the status of the indicator can include setting a flag corresponding to the particular block to indicate that the block has experienced an uncorrectable error in association with a read operation performed therein. Updating the status of the indicator can include incrementing a counter corresponding to the particular block to when the block experiences an uncorrectable error in association with a read operation performed therein. At reference 348, the particular group of memory cells (e.g., block) can be erased and reused. That is, after updating the indicator (e.g., indicator 222), the particular block can be reused in further write and/or read operations.

As illustrated at reference 344, if it is determined that the particular memory group of memory cells (e.g., block) has a previous uncorrectable error associated therewith, then at reference 350 a determination as to whether to retire the particular block can be made in response to the status of the indicator (e.g., indicator 222). For instance, control circuitry (e.g., control circuitry 208 illustrated in FIG. 2) may determine to retire the particular block if the status of the indicator indicates that the particular block has experienced a threshold number of uncorrectable errors. As discussed above, the threshold number of uncorrectable errors may be one, but can be two, three, or more uncorrectable errors. In one or more embodiments, the threshold number of uncorrectable errors can be variable. As one example, the threshold number of uncorrectable errors may be decreased based, at least partially, on the age of the memory device. The threshold number of uncorrectable errors may also be decreased based, at least partially, on the number of program/erase cycles performed on the particular block. As such, in one or more embodiments, the threshold number of uncorrectable errors may be different among the blocks of a memory device (e.g., device 210).

As indicated at reference 352, if it is determined that the status of the indicator corresponding to the particular group of memory cells indicates retirement, then the particular memory group of cells (e.g., block) is retired at reference 354. As used herein, "retiring" a group of memory cells can include, for example, no longer using the particular group of cells of the memory device for operations.

As illustrated at reference 355, if it is determined that the status of the indicator corresponding to the particular group of memory cells does not indicate retirement, then the status of the indicator is updated (e.g., by incrementing a counter). As illustrated at reference 356, the group of memory cells can be erased and reused.

As such, one or more embodiments of the present disclosure can provide, on a block by block basis, for example, an indicator having a status corresponding to whether a memory block of a memory device has a previous uncorrectable error associated therewith, determine whether an uncorrectable error has occurred in association with a read operation performed with respect to a particular block, determine the status of the indicator corresponding to the particular block, and determine whether to retire the particular block in response to the determined status of the indicator.

Therefore, embodiments of the present disclosure can improve memory system lifetime and performance and/or can reduce system failure by performing efficient block management. For instance, embodiments can retire defective groups of memory cells in an effective and efficient manner, while maintaining an effective memory capacity of the system and limiting wear.

Figure 4:
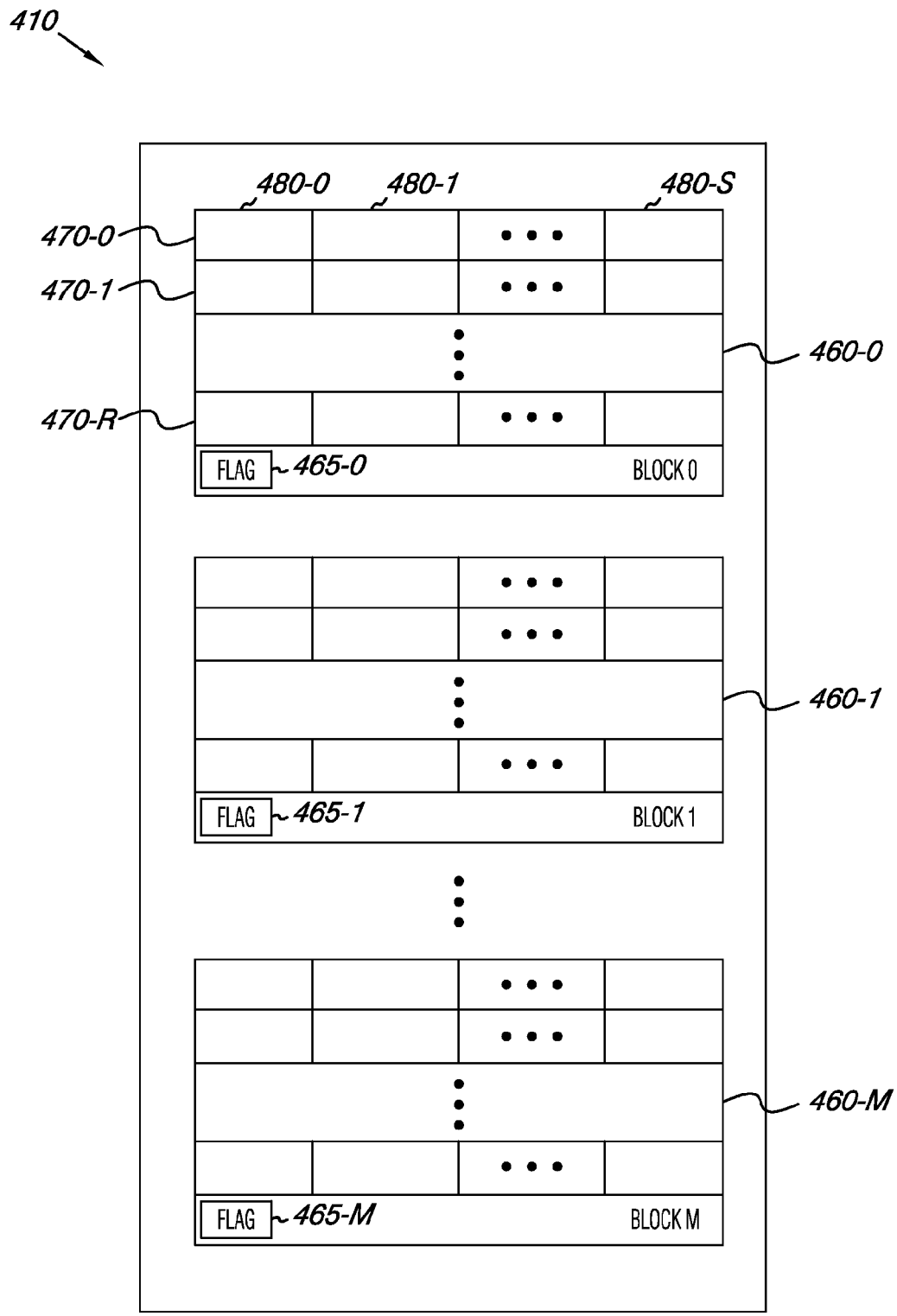
FIG. 4 illustrates a diagram of a portion of a memory device in accordance with one or more embodiments of the present disclosure.

FIG. 4 illustrates a diagram of a portion of a memory device 410 in accordance with one or more embodiments of the present disclosure. Although not shown in FIG. 4, one of ordinary skill in the art will appreciate that the memory device 410 can be located on a semiconductor die along with various peripheral circuitry associated with the operation thereof. Memory device 410 can include one or more arrays of memory cells.

As shown in FIG. 4, memory device 410 can include a number of physical blocks 460-0 (BLOCK 0), 460-1 (BLOCK 1), . . . , 460-M (BLOCK M) of memory cells. In the example shown in FIG. 4, the designator "M" is used to indicate that the memory device 410 can include a number of physical blocks. As an example, the number of physical blocks in memory device 410 may be 128 blocks, 4,096 blocks, or 32,768 blocks, however embodiments are not limited to a particular number or multiple of physical blocks in a memory device. Further, embodiments are not limited to the type of memory used in the array (e.g., non-volatile, volatile, etc.) In the embodiment illustrated in FIG. 4, the memory device 410 can be, for example, a NAND flash memory device 410 such that, for example, the memory cells in each physical block 460-0, 460-1, . . . , 460-M can be erased together as a unit (e.g., the cells in each physical block can be erased in a substantially simultaneous manner). For instance, the cells in each physical block 460-0, 460-1, . . . , 460-M can be erased together in a single erasing operation.

In the embodiment illustrated in FIG. 4, each of the blocks 460-0, 460-1, . . . , 460-M includes a respective indicator 465-0, 465-1, . . . , 465-M corresponding thereto. In this example, the indicators are flags 465-0, 465-1, . . . , 465-M. As described above, in one or more embodiments, a status of the indicators 465-0, 465-1, . . . , 465-M can be used to determine whether to retire the particular block to which the indicator corresponds. The status of the indicator 465-0, 465-1, . . . , 465-M can be updated when a read operation performed on data stored in the block results in an uncorrectable error. For instance, the flag 465-0, 465-1, . . . , 465-M can be set when a read operation results in an uncorrectable error. As such, if a subsequent read operation performed with respect to the block results in an uncorrectable error, a determination of whether to retire the particular block can be made in response to the status of the flag 465-0, 465-1, . . . , 465-M.

In the embodiment illustrated in FIG. 4, the flags 465-0, 465-1, . . . , 465-M are stored within the respective blocks 460-0, 465-0, . . . , 460-M (e.g., within the memory device 410). However, as discussed above, embodiments are not so limited. For instance, in some embodiments, the indicators 465-0, 465-1, . . . , 465-M can be stored, at least temporarily, in a volatile memory device (e.g., DRAM 212 shown in FIG. 2) and/or can be located within a controller (e.g., control circuitry 108 and 208 shown in FIGS. 1 and 2, respectively).

The designator "R" is used to indicate that a physical block (e.g., 460-0, 460-1, . . . , 460-M) can include a number of rows. In some embodiments, the number of rows (e.g., word lines) in each physical block can be 32, but embodiments are not limited to a particular number of rows 470-0, 470-1, . . . , 470-R per physical block. As one of ordinary skill in the art will appreciate, each row 470-0, 470-1, . . . , 470-R can include one or more physical pages, e.g., an even page and an odd page. A physical page refers to a unit of writing and/or reading (e.g., a number of cells that are written and/or read together or as a functional group of memory cells). Accordingly, an even page and an odd page can be written and/or read with separate writing and/or reading operations. For embodiments including multilevel cells (MLC), a physical page can be logically divided into an upper page and a lower page of data. For example, one memory cell can contribute one or more bits to an upper page of data and one or more bits to a lower page of data. Accordingly, an upper page and a lower page of data can be written and/or read as part of one writing and/or reading operation, as the logical upper page and logical lower page are both part of the same physical page. For ease of illustration, each row 470-0, 470-1, . . . , 470-R, in FIG. 4 includes only one physical and logical page, however embodiments are not so limited.

In one or more embodiments of the present disclosure, and as shown in FIG. 4, a page can store data in a number of sectors 480-0, 480-1, . . . , 480-S. The designator "S" is used to indicate that a page can include a number of sectors. Each sector 480-0, 480-1, . . . , 480-S can store system and/or user data and can include overhead information, such as error detection/correction information (e.g., ECC information) and logical block address (LBA) information. As one of ordinary skill in the art will appreciate, logical block addressing is a scheme that can be used by a host for identifying a sector of information (e.g., each sector can correspond to a unique LBA). In one or more embodiments, a sector is the smallest addressable portion of a storage volume. As an example, a sector of data can be a number of bytes of data, e.g., 256 bytes, 512 bytes, or 1,024 bytes. For example, a NAND memory device can have 4, 8, or 16 sectors in a page, where a sector can be 512 bytes, and the memory device can have 128, 256, or 512 pages per physical block, therefore physical block sizes are 131072 bytes, 262144 bytes, and 524288 bytes. Embodiments are not limited to these examples.

It is noted that other configurations for the physical blocks 460-0, 460-1, . . . , 460-M, rows 470-0, 470-1, . . . , 470-R, sectors 480-0, 480-1, . . . , 480-S, and pages are possible. For example, the rows 470-0, 470-1, . . . , 470-R of the physical blocks 460-0, 460-1, . . . , 460-M can each store data corresponding to a single sector which can include, for example, more or less than 512 bytes of data.

CONCLUSION

The present disclosure includes methods, devices, and systems for error detection/correction based memory management. One embodiment includes performing a read operation with respect to a particular group of memory cells of a memory device and, if the read operation results in an uncorrectable error, determining whether to retire the particular group of memory cells in response to a status of an indicator corresponding to the particular group of memory cells, wherein the status of the indicator indicates whether the particular group of memory cells has a previous uncorrectable error associated therewith.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of one or more of the associated listed items.

As used herein, the term "and/or" includes any and all combinations of one or more of the associated listed items. As used herein the term "or," unless otherwise noted, means logically inclusive or. That is, "A or B" can include (only A), (only B), or (both A and B). In other words, "A or B" can mean "A and/or B" or "one or more of A and B."

It will be understood that, although the terms first, second, third, etc. may be used herein to describe various elements, these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   an array of memory cells; and
   a controller configured to control:
      performing a read operation on a group of memory cells of the array of memory cells;
      responsive to determining that the read operation results in an uncorrectable error, determining whether to retire the group of memory cells based, at least partially, on a status of an indicator corresponding to the group of memory cells, wherein the status of the indicator indicates whether the group of memory cells has a previous uncorrectable error associated therewith; and
      storing the indicator in the array of memory cells; and
   wherein the controller is configured to control tracking a ratio of total uncorrectable errors to total data throughput associated with the array of memory cells.

2. The apparatus of claim 1, wherein the group of memory cells is a block of memory cells configured to be erased together.

3. The apparatus of claim 1, wherein the controller is configured to control retiring the group of memory cells if the status of the indicator indicates that a threshold number of uncorrectable errors associated with the group of memory cells has been reached.

4. The apparatus of claim 1, wherein the controller is configured to control retiring the group of memory cells if the status of the indicator indicates the group of memory cells has a previous uncorrectable error associated therewith.

5. A method, comprising:
   performing a read operation on a group of memory cells of an array of memory cells; and
   responsive to the read operation resulting in an uncorrectable error, determining whether to retire the group of memory cells based on a status of an indicator corresponding to the group of memory cells;
   wherein the status of the indicator indicates whether the group of memory cells has a previous uncorrectable error associated therewith;
   wherein the indicator is a counter, and wherein determining whether to retire the group of memory cells based on the status of the counter comprises determining whether the group of memory cells has experienced a threshold number of uncorrectable errors; and
   adjusting the threshold number of uncorrectable errors used to determine whether to retire the group of memory cells.

6. The method of claim 5, including performing the read operation via control circuitry coupled to the array of memory cells, wherein the indicator is not stored within the control circuitry.

7. The method of claim 5, wherein the threshold number of uncorrectable errors is at least three.

8. The method of claim 5, wherein adjusting the threshold number of uncorrectable errors used to determine whether to retire the group of memory cells includes reducing the threshold number of uncorrectable errors based, at least partially, on an age of the array of memory cells.

9. The method of claim 5, wherein adjusting the threshold number of uncorrectable errors used to determine whether to retire the group of memory cells includes reducing the threshold number of uncorrectable errors based, at least partially, on a number of program/erase cycles performed on the group of memory cells.

10. An apparatus, comprising:
    a host;
    a number of memory cell arrays; and
    control circuitry coupled to the number of memory cell arrays and configured to:
       perform read operations on groups of memory cells corresponding to the number of memory cell arrays;
       determine whether a read operation performed on a particular group of memory cells results in an uncorrectable error; and
       in response to determining that the read operation results in an uncorrectable error, determine whether to retire the particular group of memory cells based, at least partially, on a status of an indicator, wherein the status of the indicator indicates whether the particular group of memory cells has experienced a previous uncorrectable error;
    wherein the indicator is stored within a particular memory cell array; and
    wherein the controller is configured to adjust a threshold number of uncorrectable errors associated with the particular group of memory cells based, at least partially, on at least one of:
       an age of the memory cell array to which the particular group of memory cells corresponds; and
       an amount of program/erase cycles performed on the particular group of memory cells.

11. The apparatus of claim 10, wherein the particular group of memory cells is a block of memory cells.

12. The apparatus of claim 10, wherein the control circuitry is configured to determine whether the particular group of memory cells has experienced a threshold number of uncorrectable errors, and wherein the threshold number of uncorrectable errors is variable among different groups of memory cells.

13. The apparatus of claim 10, wherein the control circuitry is configured to track a ratio of total uncorrectable errors to total data throughput associated with the number of memory cell arrays.

\* \* \* \* \*